(12) United States Patent
Douskey et al.

(10) Patent No.: US 11,378,623 B2
(45) Date of Patent: Jul. 5, 2022

(54) DIAGNOSTIC ENHANCEMENT FOR MULTIPLE INSTANCES OF IDENTICAL STRUCTURES

(71) Applicant: International Business Machines Corporation, Armonk, NY (US)

(72) Inventors: Steven Michael Douskey, Rochester, MN (US); Orazio Pasquale Forlenza, Hopewell Junction, NY (US); Mary P. Kusko, Hopewell Junction, NY (US); Franco Motika, Hopewell Junction, NY (US); Gerard Michael Salem, Willsboro, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/115,434

(22) Filed: Dec. 8, 2020

(65) Prior Publication Data
US 2022/0178996 A1 Jun. 9, 2022

(51) Int. Cl.
| | | |
|---|---|---|
| *G01R 31/3185* | (2006.01) | |
| *G01R 31/3187* | (2006.01) | |
| *G11C 29/16* | (2006.01) | |
| *G01R 31/3183* | (2006.01) | |

(52) U.S. Cl.
CPC . *G01R 31/318547* (2013.01); *G01R 31/3183* (2013.01); *G01R 31/3187* (2013.01); *G01R 31/318538* (2013.01); *G01R 31/318566* (2013.01); *G11C 29/16* (2013.01)

(58) Field of Classification Search
CPC ........ G01R 31/318547; G01R 31/3183; G01R 31/318538; G01R 31/318566; G01R 31/3187; G11C 29/16
See application file for complete search history.

(56) References Cited

U.S. PATENT DOCUMENTS

| | | |
|---|---|---|
| 5,535,164 A | 7/1996 | Adams et al. |
| 5,930,270 A | 7/1999 | Forlenza et al. |
| 6,715,105 B1 | 3/2004 | Rearick |
| 6,807,645 B2 | 10/2004 | Angelotti et al. |
| 6,829,728 B2 | 12/2004 | Cheng et al. |
| 6,968,489 B2 | 11/2005 | Motika et al. |
| 6,971,054 B2 | 11/2005 | Kurtulik et al. |

(Continued)

OTHER PUBLICATIONS

G. A. Sarrica, "Theory and Implementation of LSSD Scan Ring & STUMPS Channel Test and Diagnosis," Thirteenth IEEE/CHMT International Electronics Manufacturing Technology Symposium, Baltimore, MD, USA, 1992, pp. 195-200. (Year: 1992).*

(Continued)

*Primary Examiner* — Cynthia Britt
(74) *Attorney, Agent, or Firm* — Patterson + Sheridan, LLP (57) ABSTRACT

A method includes executing a test against a first structure and a second structure of a built-in self-test circuit. Each of the first and second structures include a plurality of latches arranged as a plurality of stump chains. The method also includes unloading a first result of the test from the plurality of stump chains of the first structure and a second result of the test from the plurality of stump chains of the second structure. The method further includes determining that the plurality of stump chains of the first structure includes a faulty latch based on the first result not matching the second result.

18 Claims, 9 Drawing Sheets

(56) References Cited

U.S. PATENT DOCUMENTS

| | | |
|---|---|---|
| 7,487,420 B2 | 2/2009 | Keller |
| 7,856,582 B2 | 12/2010 | Cervantes et al. |
| 8,843,797 B2 | 9/2014 | Motika et al. |
| 9,372,232 B2 | 6/2016 | Douskey et al. |
| 9,384,856 B2 | 7/2016 | Spruth et al. |
| 9,746,516 B2 | 8/2017 | Douskey et al. |
| 10,024,914 B2 | 7/2018 | Douskey et al. |
| 10,247,776 B2 | 4/2019 | Kusko et al. |
| 2002/0125907 A1* | 9/2002 | Kurtulik ............ G01R 31/3185 324/762.02 |
| 2002/0194558 A1 | 12/2002 | Wang et al. |
| 2005/0138514 A1* | 6/2005 | Burdine ......... G01R 31/318569 714/733 |
| 2007/0011537 A1 | 1/2007 | Kiryu |
| 2009/0089636 A1 | 4/2009 | Fernsler et al. |
| 2009/0210763 A1* | 8/2009 | Eckelman ...... G01R 31/318536 714/731 |
| 2010/0095177 A1* | 4/2010 | Forlenza ............ G01R 31/3183 714/731 |
| 2011/0055646 A1 | 3/2011 | Mukherjee et al. |
| 2011/0307750 A1* | 12/2011 | Narayanan ......... G01R 31/3177 714/729 |

OTHER PUBLICATIONS

N. R. Kiran and S. Yellampalli, "Low hardware cost STUMPS BIST," International Conference on Circuits, Communication, Control and Computing, Bangalore, India, 2014, pp. 89-92. (Year: 2014).*

M. R. Gowthami, N. R. Kiran, G. Harish and S. Yellampalli, "Test power aware STUMP BIST," 2015 International Conference on Smart Technologies and Management for Computing, Communication, Controls, Energy and Materials (ICSTM), Avadi, India, 2015, pp. 434-438. (Year: 2015).*

* cited by examiner

DIAGNOSTIC ENHANCEMENT FOR MULTIPLE INSTANCES OF IDENTICAL STRUCTURES

BACKGROUND

The present invention relates to built-in self-test circuits, and more specifically, to diagnosing faulty circuit elements using built-in self-test circuits.

SUMMARY

According to one embodiment, a method includes executing a test against a first structure and a second structure of a built-in self-test circuit. Each of the first and second structures include a plurality of latches arranged as a plurality of stump chains. The method also includes unloading a first result of the test from the plurality of stump chains of the first structure and a second result of the test from the plurality of stump chains of the second structure. The method further includes determining that the plurality of stump chains of the first structure includes a faulty latch based on the first result not matching the second result. Other embodiments include an apparatus and a system that perform this method.

DETAILED DESCRIPTION

Built-in self-test (BIST) circuits are designed with structures that allow tests to be executed directly against circuit logic connected to the BIST circuits. The test results indicate whether the BIST circuits or the circuit logic are faulty. These tests, however, may not reveal which components are faulty. This disclosure contemplates various ways of unloading and analyzing the test results from BIST circuits to determine which components of the BIST circuits or the circuit logic are faulty. In one embodiment, results from the same test are unloaded from different structures of a BIST circuit, and the results are compared with each other. When a mismatch in the results is discovered, a logged test loop and shift counter reveal the faulty component of the BIST circuit or circuit logic corresponding to the mismatch. These processes will be discussed in more detail using FIGS. 1 through 9.

Figure 1:
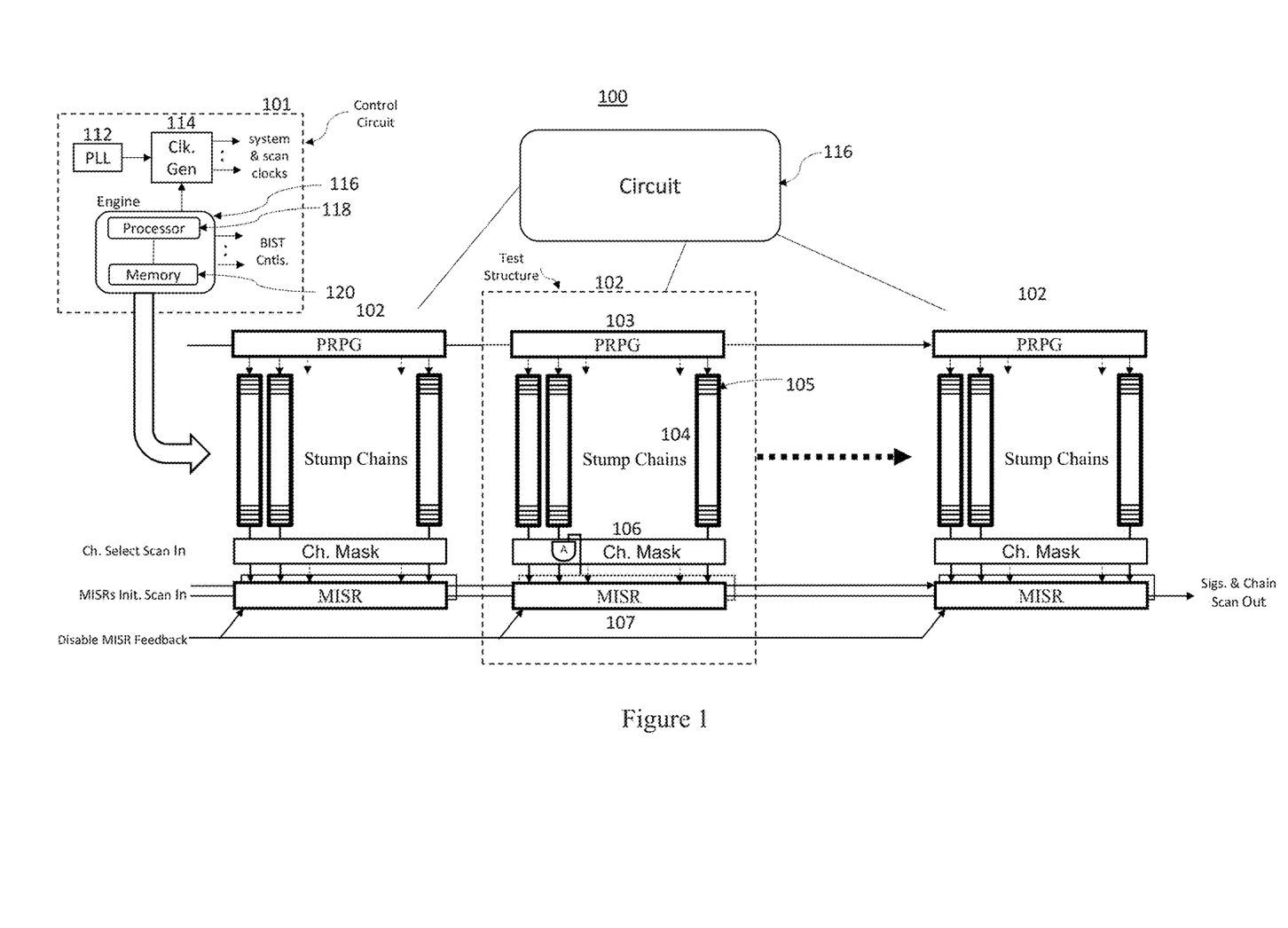
FIG. 1 illustrates an example system.

With reference now to FIG. 1, which shows an example system 100. As seen in FIG. 1, the system 100 includes a control circuit 101, one or more test structures 102, and a circuit 116 which includes circuit logic between the latches in the STUMP chains 104. Generally, the control circuit 101 uses the one or more test structures 102 to test not only the STUMP chains 104, but the circuit 116 as well. The control circuit 101 loads test data into the test structures 102 and then executes the test against the circuit 116. The control circuit 101 then unloads test results from the test structures 102. The test results may be analyzed to determine fault detection locations within the structures 102. In certain embodiments, the test structures 102 may be logically identical to one another.

The system 100 may include any suitable number of control circuits 101 to control any suitable number of test structures 102. In some embodiments, the system 100 includes multiple instances of test structures 102 depicted as rows of test structures 102. Each row of test structures is controlled by a control circuit 101. Separate control circuits 101 may be used to control separate rows of test structures 102, or one control circuit 101 may be used to control multiple rows of test structures 102. For clarity, FIG. 1 depicts one control circuit 101 and one row of test structures 102.

The control circuit 101 includes a phase-locked loop 112, a clock generator 114, and a BIST control engine 116. Generally, the phase-locked loop 112 and the clock generator 114 operate together to generate one or more clock signals that control other components of the system 100 (e.g., the test structures 102). The engine 116 controls clocking, the loading of test data, and the unloading of test results from the one or more test structures 102.

The phase-locked loop 112 generates a signal with a particular frequency. For example, the phase-locked loop 112 may include a variable frequency oscillator and a phase detector in a feedback loop. The phase-locked loop 112 uses this feedback loop to produce an output signal with a particular frequency.

The clock generator 114 may generate one or more clock signals using the output signal of the phase-locked loop 112. For example, the clock generator 114 may include circuit elements that multiply or divide the output signal of the phase-locked loop 112 by one or more ratios. In this manner, the clock generator 114 produces output signals that have frequencies that are ratios of the frequency of the output signal of the phase-locked loop 112. The clock generator 114 communicates these clock signals to other components of the system 100 to control the timing and operation of these components.

The engine 116 controls the loading of test data and the unloading of test results from the test structures 102. As seen in FIG. 1, the engine 116 may include a processor 118 and a memory 120, which are configured to perform any of the functions or actions of the control circuit 101 described herein. In particular embodiments by unloading and analyzing the test results from the test structure 102, the control circuit 101 may determine a fault detection location within the structure 102.

The processor 118 is any electronic circuitry, including, but not limited to microprocessors, application specific integrated circuits (ASIC), application specific instruction set processor (ASIP), and/or state machines, that communicatively couples to memory 120 and controls the operation of the control circuit 101. The processor 118 may be 8-bit, 16-bit, 32-bit, 64-bit or of any other suitable architecture. The processor 118 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The processor 118 may include other hardware that operates software to control and process information. The processor 118 executes software stored on memory to perform any of the functions described herein. The processor 118 controls the operation and administration of the control circuit 101 by processing information (e.g., information received and loaded from the external test system). The processor 118 may be a programmable logic device, a microcontroller, a microprocessor, any suitable processing device, or any suitable combination of the preceding. The processor 118 is not limited to a single processing device and may encompass multiple processing devices.

The memory 120 may store, either permanently or temporarily, data, operational software, or other information for the processor 118. The memory 120 may include any one or a combination of registers or built in array memory suitable for storing BIST test sequencing and data logging information. For example, the memory 120 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory 120, a disk, a CD, or a flash drive. In particular embodiments, the software may include an application executable by the processor 118 to perform one or more of the functions described herein. In certain embodiments, the engine 116 is an integrated state machine to control the execution of the test. The engine 116 is setup or loaded by an external test system and does not access external memory during the test execution.

Each test structure 102 includes a pseudo random pattern generator (PRPG) 103, one or more stump chains 104 that each contain one or more latches 105, a channel mask 106, and a multiple input signature register (MISR) 107. For clarity, only the components of one test structure 102 in FIG. 1 have been labeled, however, the system 100 may include any suitable number of test structures 102 that include these components.

The control circuit 101 loads test data into the one or more PRPGs 103. In some embodiments the control circuit 101 provides data to the PRPGs 103, and the PRPGs 103 use this data to generate pseudo random test data. Each PRPG 103 loads test data into the stump chains 104 of its corresponding test structure 102.

Each stump chain 104 includes one or more latches 105. The stump chains 104 in a test structure 102 are arranged in parallel. The latches 105 in a stump chain 104 are arranged serially (e.g. concatenated as in a scan chain). The PRPG 103 of a test structure 102 serially loads test data into the stump chains 104 of the test structure 102. The test data may be loaded in parallel into all the stump chains 104 concurrently by all PRPGs 103. Each latch 105 may be used to test a different component or portion of the logic circuits between the scan chains in instance 116. For example, as the latches are clocked the test data propagates from and through the latches 105, various components of the logic test circuit 116 between the stump chains are stimulated. Responses are captured in the corresponding stump latches 105 of test structure 102. In this manner, after the test data has been propagated by the system clocks 114, the latches 105 in the stump chains 104 may hold the results of the test.

The channel mask 106 and the MISR 107 collect and compress the test results from the stump chains 104. The channel mask 106 may block (via gating) any combination of the stump chains 104 from reaching the MISR 107. The MISR 107 reads the results from the unblocked stump chains 104 and compresses these results into a signature. The control circuit 101 compares the signature in the MISR 107 with a reference signature to determine if the circuit 116 passed the test. For example, if the signature in the MISR 107 matches the reference signature, then the control circuit 101 may determine that the circuit 116 passed the test. On the other hand, if the signature in the MISR 107 does not match the reference signature, then the control circuit 101 may determine that the circuit 116 did not pass the test.

As seen in FIG. 1, certain components of the test structures 102 in a row may be arranged serially. For example, the PRPGs 103 and the MISRs 107 may be serialized so that the control circuit may load data into a first PRPG 103 and MISR 107 (e.g., on the left) and that data propagates to a last PRPG 103 and MISR 107 (e.g., on the right). In some embodiments, these components may not be serialized, and instead, allow for parallel load and unload. In some embodiments, the MISRs 107 include a feedback disable to allow for serial load and unload of the MISRs 107.

This disclosure describes various ways that the control circuit 101 may unload and analyze the test results from the stump chains 104 to determine the faulty components within a tested circuit. These processes are described with respect to FIGS. 2 through 8.

Figure 2:
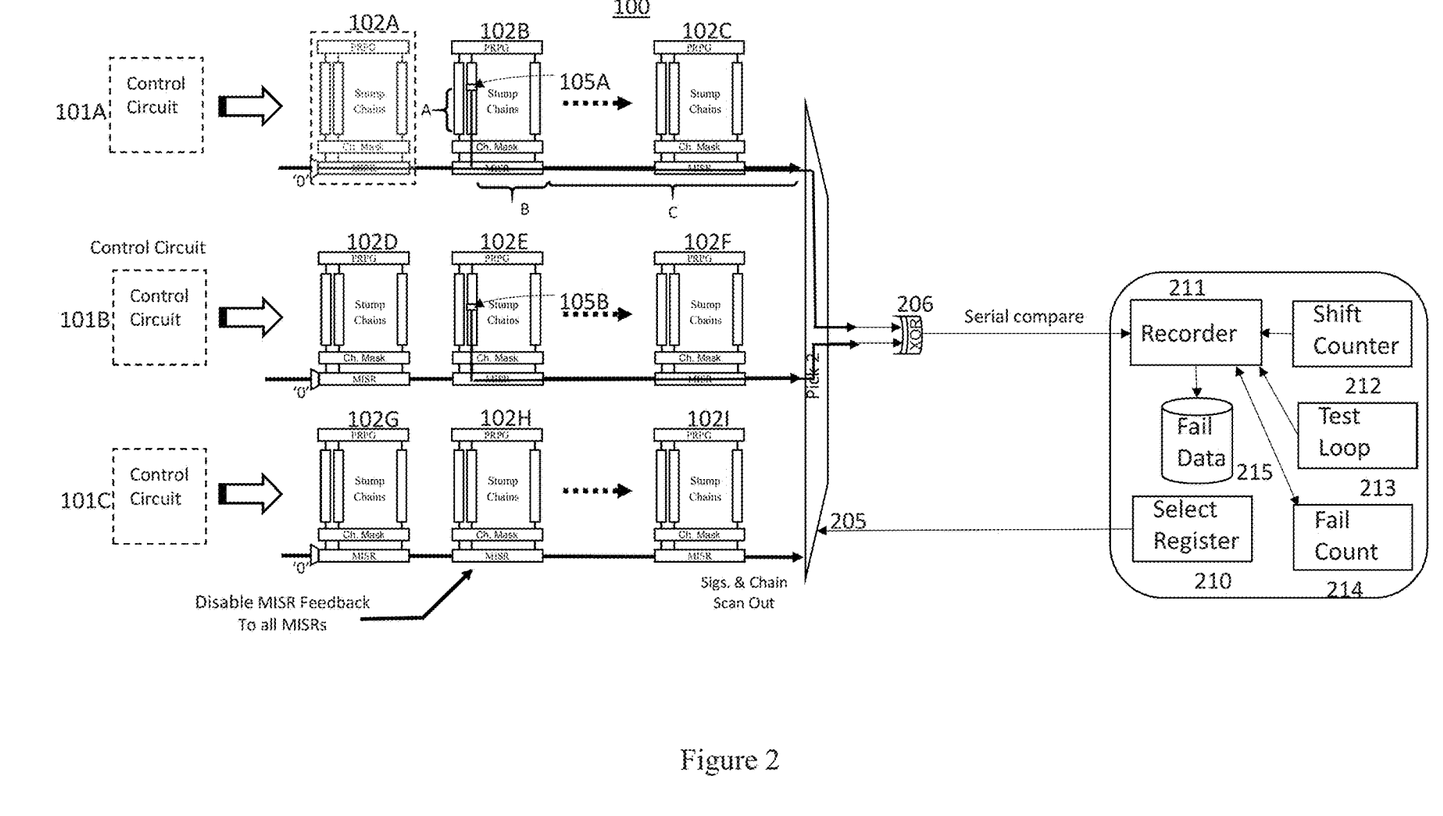
FIG. 2 illustrates an example unload in the system of FIG. 1.

FIG. 2 illustrates an example unload in the system 100 of FIG. 1. As seen in FIG. 2, the system 100 includes multiple instances (depicted as rows) of stump structures 102. A control circuit 101 controls each instance of stump structures 102. In the example of FIG. 2, the control circuit 101A controls the instance that includes stump structures 102A, 102B, and 102C. The control circuit 101B controls the instance that includes stump structures 102D, 102E, and 102F. The control circuit 101C controls the instance that include stump structures 102G, 102H, and 102I. The system 100 also includes a selector 205, a comparator 206, a select register 210, a recorder 211, and a database 215. In particular embodiments, the control circuits 101A, 101B, and 101C may be replaced with a single control circuit 101 that controls every instance of stump structures 102. Alternately there could be a unique control circuit for each stumps structure. In some embodiments, the select register 210, the recorder 211, and the database 215, are implemented as part of a control circuit 101 and may interface with the external test system. For clarity, certain components in the system 100 are illustrated in FIG. 2 but not labeled, but these components share the label provided in FIG. 1.

In the example of FIG. 2, the control circuits 101 initially execute the same test throughout each instance of stump structures 102. Each stump structure 102 may test a different portion of the logic circuit between its stump chains, however, stump structures 102 that are in the same column (e.g., stump structures 102A, 102D, and 102G) test portions of the logic circuit that are identical. Thus, when the same test is propagated through the stump structures 102 in a column, it is expected that the MISRs 107 in those stump structures 102 should include the same signatures for a 'good' or passing test. After the tests are complete, the test results are compressed into the MISRs 107 to form signatures. These signatures in the MISRs 107 are compared with reference signatures to determine which instances failed the test, and which instances passed the test. In the example of FIG. 2, the MISRs 107 reveal that the top instance failed the test, and the middle instance passed the test. These signatures, however, may not reveal which circuit elements, stump chain 104, and latches 105 failed the test or which test cycle they failed.

After the passing and failing instances are determined, the control circuits 101 toggle the system 100 into a second phase to diagnose the failure(s) and to determine the faulty components. The select register 210 generates a control signal to the selector 205 to select the outputs of the top (e.g. failing) and middle (e.g. passing) instances for comparison. Additionally, the control circuits 101 toggle the MISRs 107 of the top and middle instances to operate as shift registers. The control circuits 101 re-execute the test using the top and middle instances. Generally, the control circuits 101 then unload and compare the test results from the two instances using the passing instance as a reference. In the example of FIG. 2, because the top instance failed the initial test and the middle instance passed the initial test, the results from the middle instance are compared with the results from the top instance with the results from the middle instance serving as the reference.

Generally, after the test results are loaded into the stump chains 104, the control circuits 101 toggle the channel mask 106 to unload the test results from a pair of corresponding stump chains 104 in the instances (e.g., the same stump chains 104 in test structures 102 in the same column). These test results are compared to determine a mismatch indicating a test failure. The comparison and results are then logged. The control circuits 101 then toggle the channel mask 106 to unload the test results from the next pair of corresponding stump chains 104 in the instances. These test results are compared to determine a mismatch indicating a test failure. The comparison and results are then logged. This process continues until the results from all the stump chains 104 in the instances have been unloaded and compared.

In the example of FIG. 2, the control circuits 101 have toggled the channel masks 106 to unload test results from the second stump chains 104 in the test structures 102B and 102E. The remaining stump chains 104 in the instances are blocked. The test results from these stump chains 104 are loaded into corresponding MISRs 107. Because the MISRs 107 are toggled to operate as shift registers, with the compression disabled, the test results from the stump chains 104 are shifted through the MISRs 107 of the instances towards the selector 205. Based on the control signal generated by the select register 210, the selector 205 selects the results from the top and middle instances for comparison by the comparator 206.

The recorder 211 then records the results of the comparison, as well as information about the test results. If there is a mismatch in the test results, the recorder 211 logs the mismatched results in the database 215. Additionally, the recorder 211 increases the fail count 214. The recorder 211 also logs the test loop 213 where the mismatch occurred. Additionally, based on where in the test result sequence the mismatch occurred, the recorder 211 logs information that indicates the latch 105 of the stump chain 104 where the mismatch occurred. For example, the shift counter 212 may indicate a value A that identifies the position of the latch 105 in the stump chain 104, a value B that indicates the stump chain 104 in the test structure 102, and a value C that indicates the test structure 102 in the instance. Using this information, the exact latch 105 where the mismatch occurred may be identified.

In the example of FIG. 2, a mismatch is determined between a latch 105A and a corresponding latch 105B in the stump chains 104. As a result, the recorder 211 logs the values A, B and C in the shift counter 212 that identify the latch 105, the stump chain 104, and the test structure 102 where the mismatch occurred. Additionally, the recorder 211 logs the test results that show the mismatch in the database 215. The recorder 211 also logs the test loop 213, so that the test data for that test loop may be identified. Using all this information, a control circuit 101 or an administrator may determine the test results that mismatched, the circuit elements that were being tested by the latches 105 that triggered the mismatch, and the test data that was used to test these faulty circuit elements. As a result, the control circuit 101 and the administrator may locate and diagnose the cause of the fault. In some embodiments, multiple failing latches 105 in the same stump chain 104 or different stump chains 104 can be identified by repeating the diagnostic process.

After the results from the pair of stump chains 104 have been unloaded and compared, the control circuits 101 adjusts the channel masks 106 to begin unloading the next stump chains 104 in the instances (e.g., the third stump chains 104 in the test structures 102B and 102E). The results from the next stump chains 104 are compared and analyzed to determine any mismatches. This process may continue until every mismatch in all the stump chains 104 in the instances has been unloaded, compared, and analyzed. After the test results from every stump chain 104 have been unloaded and compared, the control circuits 101 and the administrator may review the fail count 214 to determine the number of determined mismatches. Additionally, the control circuits 101 and the administrator may review the shift counter 212, test loop 213, and the database 215 to identify the faulty latches 105 and the corresponding faulty circuit elements, and to diagnose the reason for the faults.

Figure 3:
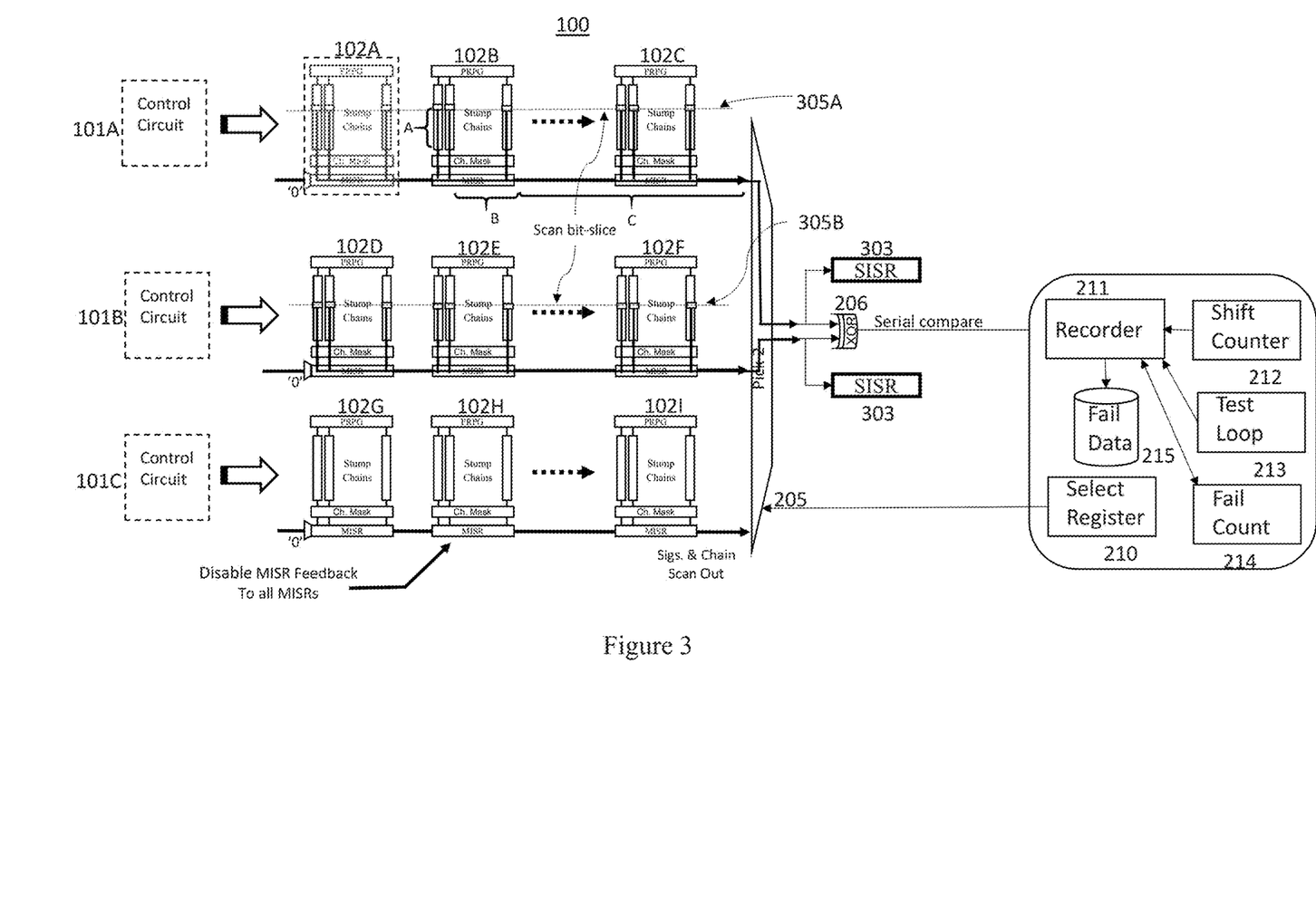
FIG. 3 illustrates an example unload in the system of FIG. 1.

FIG. 3 illustrates an example unload in the system 100 of FIG. 1. Generally, the process shown in FIG. 3 is similar to the process shown in FIG. 2 except each unload and compare in the process of FIG. 3 is performed on a slice 305 of latches 105 rather than on a stump chain 104. As seen in FIG. 3, during one unload and compare, a latch 105 from every stump chain 104 in the top and middle instances is unloaded and sent to the selector 205. The results from these latches 105 are then compared and mismatches are recorded. The next latches 105 in the stump chains 104 may then be unloaded and compared in a similar manner. This process may continue until every latch 105 in the stump chains 104 have been unloaded and compared. For clarity, certain components in the system 100 are illustrated in FIG. 3 but not labeled, but these components share the label provided in FIG. 1.

As with the example of FIG. 2, the control circuits 101 may execute an initial test on the instances of test structures 102. The control circuits 101 may then compare the MISRs 107 of the various instances to determine which instances passed the initial test and which instances failed the initial test. In the example of FIG. 3, the control circuits 101 determine that the top instance failed the initial test and the middle instance passed the initial test. The select register 210 may then generate a control signal that causes the selector 205 to select the outputs of the top and middle instances. The control circuits 101 may then toggle the channel mask 106 in the top and middle instances to pass the outputs of all stump chains 104 in the test structures 102 of the top and middle instances. The MISRs 107 may then read a slice 305 of latches 105 from the stump chains 104 of the instances. When the results of these latches 105 are read into the MISRs 107, the MISRs 107 shift these results to the selector 205 and the comparator 206. The comparator 206 compares these results and the recorder 211 records any mismatches along with the information corresponding to the mismatches. The MISRs 107 may then unload the next slice 305 of latches 105 from the stump chains 104 for comparison at the comparator 206. In the example of FIG. 3, a slice 305A of latches 105 are unloaded from the top instance and a slice 305B of latches 105 are unloaded from the middle instance. The latches 105 are shifted to the comparator 205 and compared by the comparator 206 to detect mismatches.

As seen in FIG. 3, the system 100 includes one or more single input signature registers 303. As the results are unloaded from the stump chains 104, the results are compressed into the SISRs 303 to generate a signature for the compared instances. In certain embodiments, the signatures in the SISRs 303 are used to determine which instances passed or failed the initial test rather than initially executing the test and comparing the MISRs 107 with the reference signature. For example, the test may be executed against the instances and then the test results from the slices of latches 105 are unloaded and compared. The test results are also compressed into the SISRs 303 to generate a signature for the instances. At the end of the unloading comparison, the signatures in the SISRs 303 may be compared with the reference signature to determine which instances passed and which instances failed. The control circuits 101 may then determine, for any mismatch, which instance contained the faulty latch 105 and which instance contained the passing latch 105.

Figure 4:
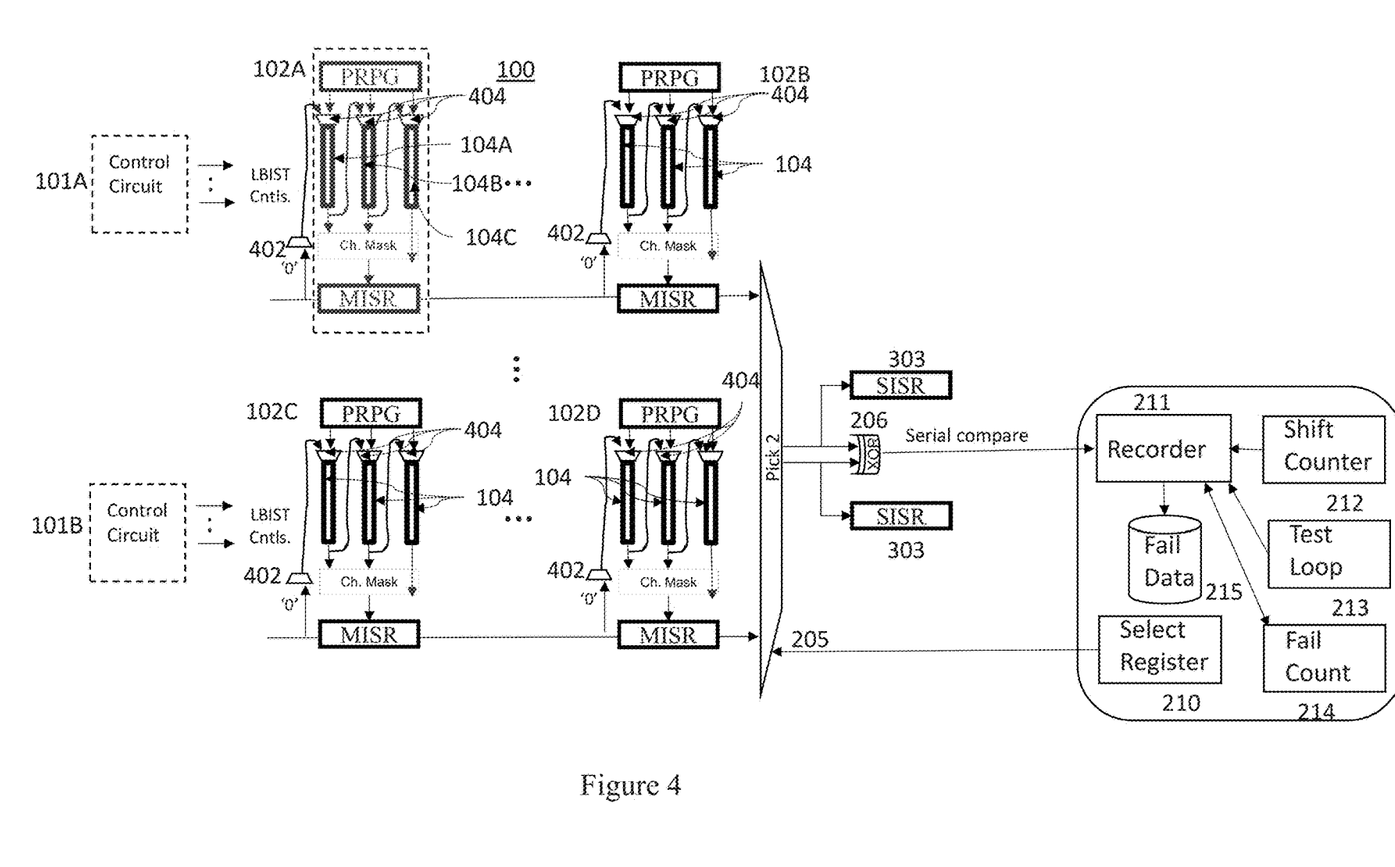
FIG. 4 illustrates an example unload in the system of FIG. 1.

FIG. 4 illustrates an example unload in the system 100 of FIG. 1. Generally, the process shown in FIG. 4 is similar to the process shown in FIG. 2, except the process in FIG. 4 serially unloads the latches 105 of the stump chains 104. As seen in FIG. 4, the stump chains 104 in a test structure 102 may be toggled to unload test results to the channel mask 106 or serially through the stump chains 104. For example, the test structure 102A includes stump chains 104A, 104B, and 104C. The stump chains 104A, 104B, and 104C may unload their test results in parallel through the channel mask 106 to the MISR 107, such as for example, during initial test execution so that the signature in the MISR 107 may be compared with a reference signature to determine if the test structure 102A passed the test. Additionally, the stump chains 104A, 104B, and 104C may be toggled, so that the stump chains 104A, 104B, and 104C unload their results serially through one another. For example, the stump chain 104A may unload its results into the stump chain 104B. The stump chain 104B may unload its test results to the stump chain 104C, and the stump chain 104C may unload its test results through the channel mask 106 to the MISR 107. The serial unload may be used when unloading and comparing the test results from the test structures 102. For clarity, certain components in the system 100 are illustrated in FIG. 4 but not labeled, but these components share the label provided in FIG. 1.

During test execution, the control circuits 101 may send test data from the PRPG 103 into the stump chains 104. The test may then be executed, and the results stored in the stump chains 104. During unload and compare, the control circuits 101 may toggle the multiplexers 404 to serially unload data through the stump chains 104. Additionally, the control circuits 101 may toggle the channel mask 106 to pass information from the last stump chain 104 in the subsequent test structure 102. The control circuit 101 may also toggle the MISR 107 to operate as a shift register, so that the result from the last stump chain 104 is shifted to other test structures 102 towards the selector 205. The control circuits 101 also toggle a multiplexer 402 on each test structure 102 to shift the test results from a previous MISR 107 into the stump chains 104 of the test structure 102. In this manner, the test results from the stump chains 104 are serially unloaded through the stump chains 104 of each test structure 102. For example, the test results from a test structure 102A are shifted by the MISR 107 in the test structure 102A towards a test structure 102B. The multiplexer 402 in the test structure 102B then sends these test results into the stump chains 104 of the test structure 102B. The stump chains 104 in the test structure 102B then serially unload these test results through the channel mask 106 and the MISR 107 of the test structure 102B. The MISR 107 in the test structure 102B shifts the test results to the selector 205. In this manner, the test results from the instance are shifted serially to the selector 205. Likewise, the test results from another instance that includes test structures 102C and 102D are also shifted to the selector 205. The comparator 206 compares these test results and the recorder 211 identifies and logs mismatches. Additionally, the results may be compressed into the SISRs 303. As discussed with example of FIG. 2, the signatures in the SISRs 303 may be used to determine which instance contained faulty latches 105 or faulty components, rather than executing the initial test and comparing the signatures in the MISRs 107 with the reference signature. As shown in FIG. 4, each instance may include any suitable number of test structures 102. For clarity, each test structure 102 has been shown with three stump chains 104, but each test structure 102 may include any suitable number of stump chains 104.

Figure 5:
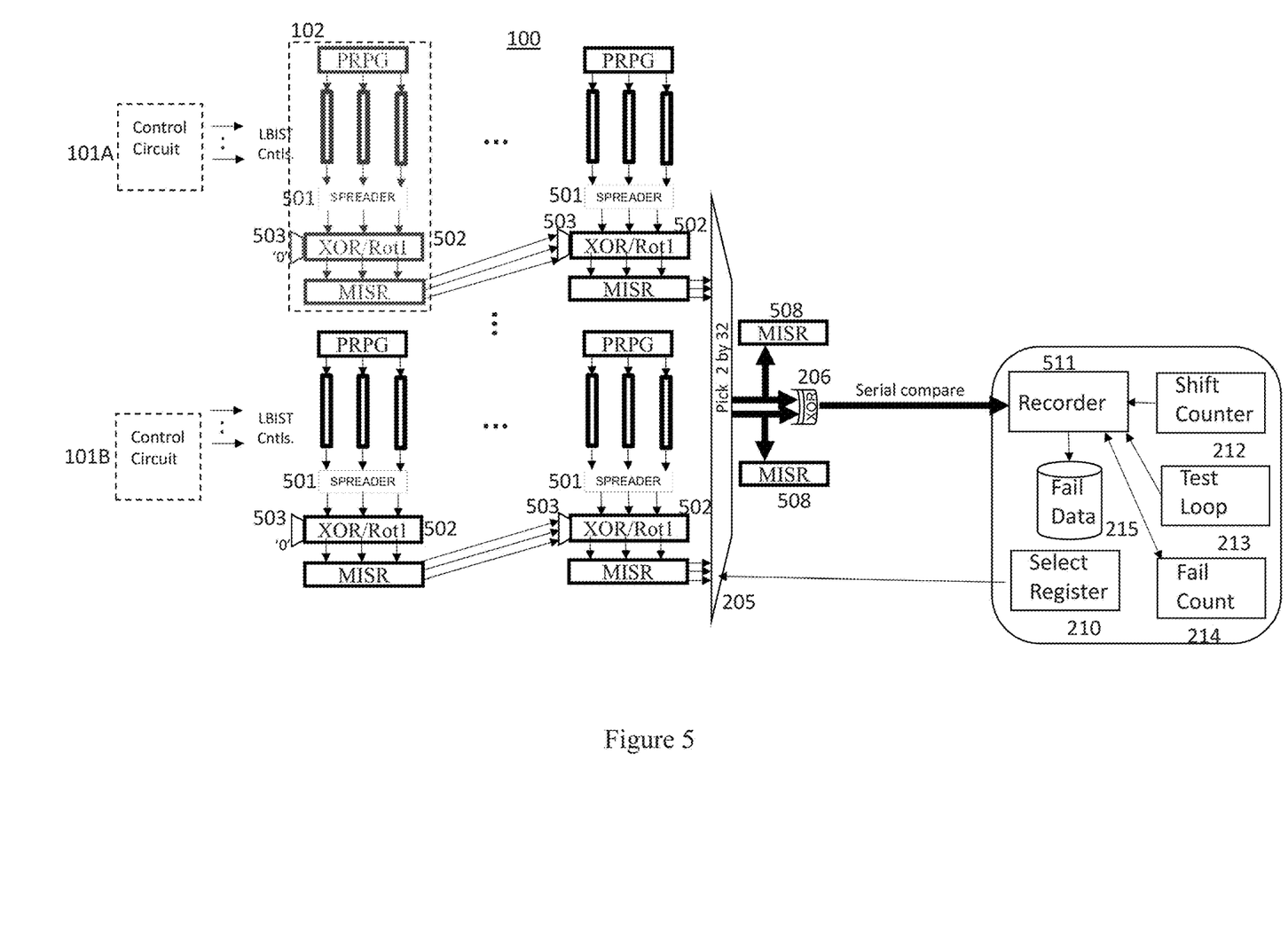
FIG. 5 illustrates an example compression in the system of FIG. 1.
Figure 6:
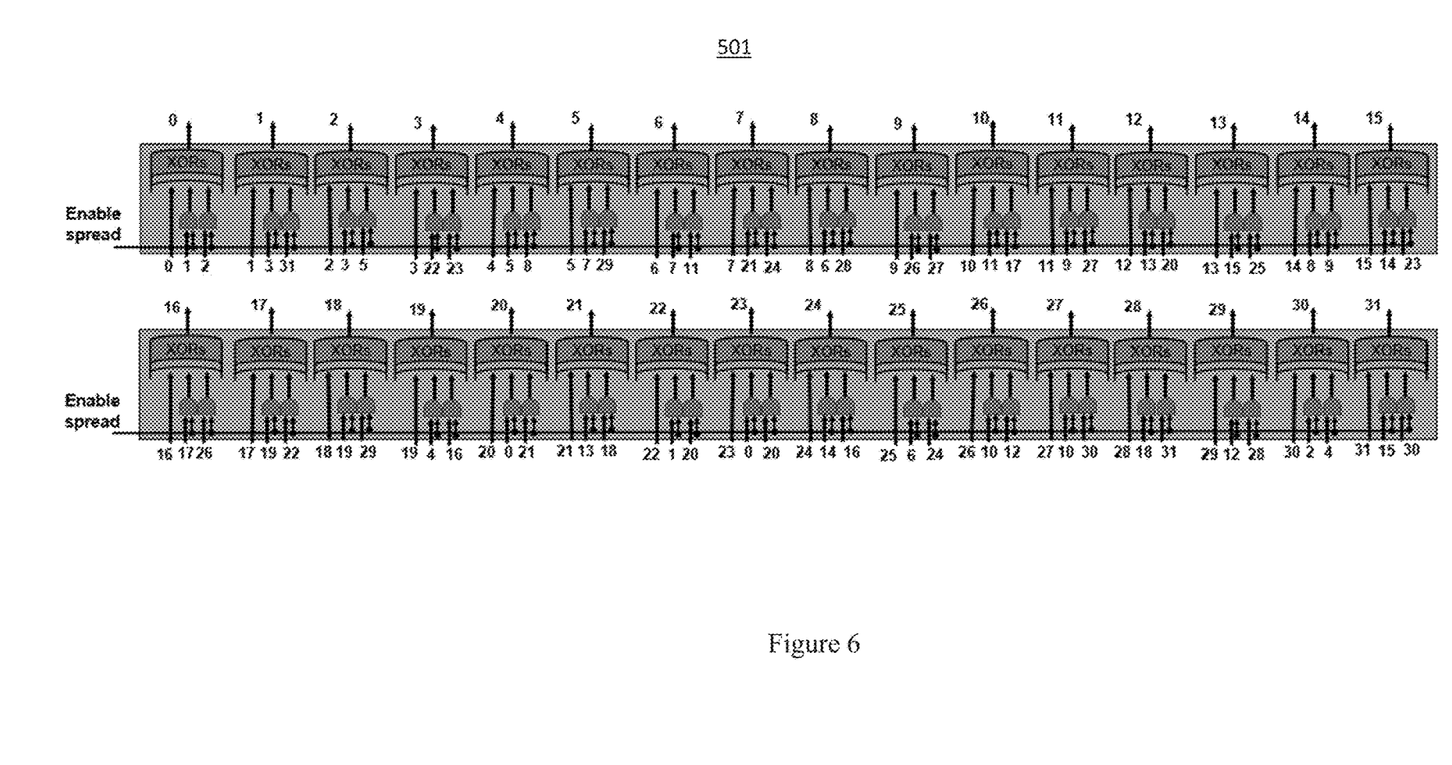
FIG. 6 illustrates an example spreader circuit in the system of FIG. 5.
Figure 7:
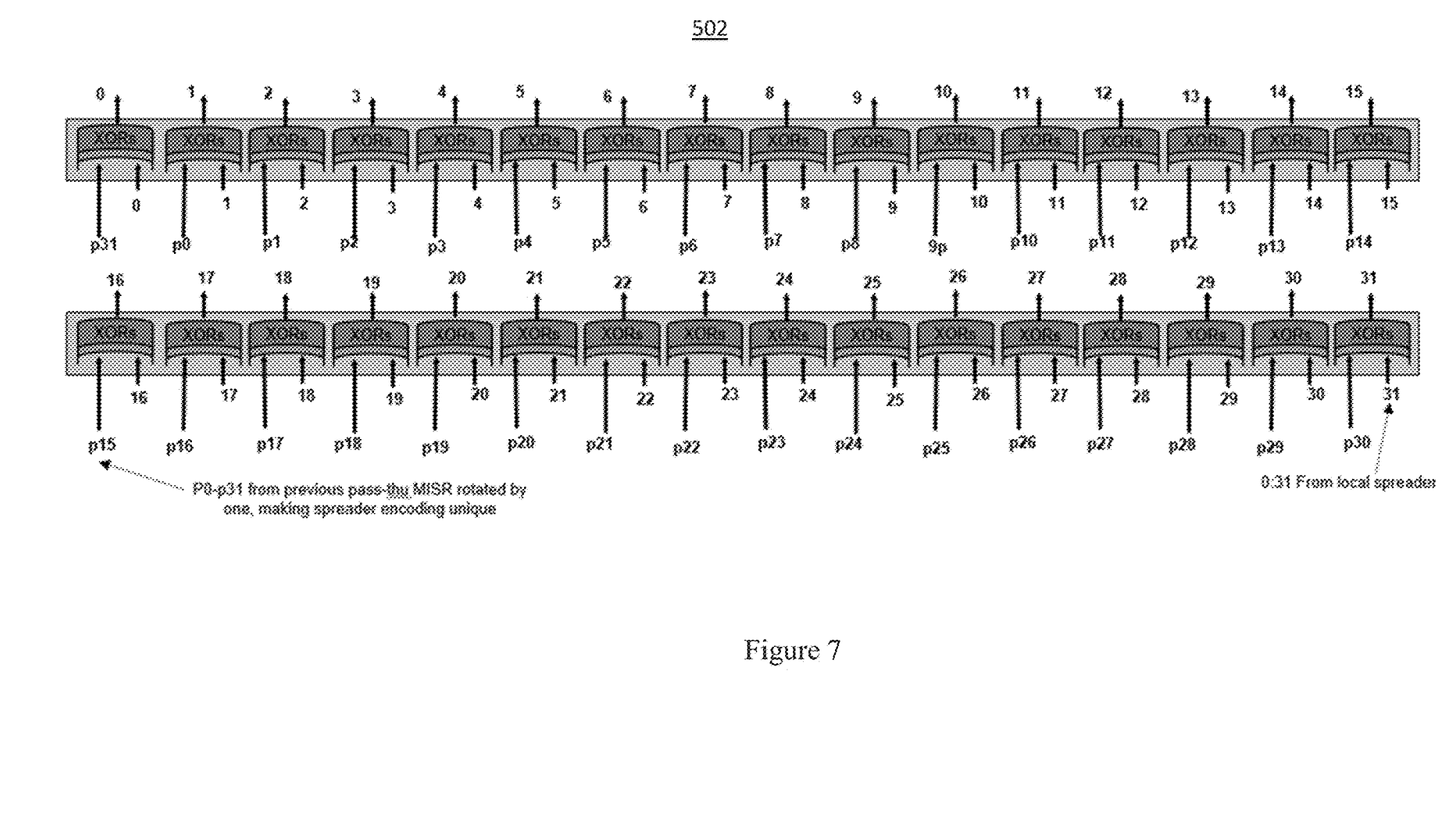
FIG. 7 illustrates an example XOR/Rotation circuit in the system of FIG. 5.

FIGS. 5 through 7 illustrate an example compression enhancement in the system 100 of FIG. 1 that may be made to one or more of the unload processes described herein. Generally, the compression is performed during unload by spreading the results of multiple stump chains 104 in a test structure 102, and then rotating and combining the spread results with the spread results of the other test structures 102 in an instance. The compressed results for the instances are then compared to determine mismatches. The recorder 511 may include enhancements that allow the recorder 511 to decompress or interpret the comparison result. For clarity, certain components in the system 100 are illustrated in FIG. 5 but not labeled, but these components share the label provided in FIG. 1.

In the example of FIG. 5, the test structure 102 includes a spreader circuit 501 and a XOR/rotation circuit 502. Generally, the spreader circuit 501 spreads the test results from the stump chains 104 in the test structure 102. The XOR/rotation circuit 502 then combines the result from the spreader circuit 501 with the rotated results of previous test structures 102 in the instance. The XOR/rotation circuit 502 then passes the combined result to the MISR 107. The MISR 107 shifts the combined result to the next test structure 102 in the instance via a multiplexer 503, where the combined result is again combined with the rotated spread result from that test structure 102. The combined result of the instance is eventually passed to the selector 205. The comparator 206 then compares the combined results from the two instances to determine mismatches. The combined results from the instances may be compressed into the MISRs 508 for subsequent analysis to determine which instance included the faulty latch 105 or the faulty circuit element.

The recorder 511 records the combined results from the instances and logs information about any detected mismatches. The recorder 511 may include enhancements that allow the recorder 511 to decompress or interpret the combined results from the instances. For example, the recorder 511 may decompress or interpret the combined results to identify the test structure 102, stump chain 104, and faulty latch 105. The spreader circuit 501 and XOR/rotation circuit 502 are described in more detail with respect to FIGS. 6 and 7. In some embodiments, decompression or interpretation of the combined results to identify failing latches 105 may be performed post-test by an external test system.

FIG. 6 illustrates an example spreader circuit 501 in the system 100 of FIG. 5. As seen in FIG. 6, the spreader circuit 501 includes multiple XOR gates that receive inputs from one or more stump chains 104 of the test structure 102. The results from the stump chains 104 are spread to the various XOR gates within the spreader circuit 501. As seen in FIG. 6, the outputs from the stump chains 104 (e.g., outputs 0 through 31) are presented in order as the first inputs to the XOR gates of the spreader circuit 501. Each XOR gate also receives inputs from two additional stump chains 104. The two additional stump chains 104 for any XOR gate may be organized such that each XOR gate receives a sequence of outputs from a different combination of stump chains 104. For example, a first XOR gate (XOR 0) receives inputs from stump chains 0, 1, and 2, while a second XOR gate (XOR 1) receives inputs from stump chains 1, 3, and 31. The outputs of the XOR gates are then output from the spreader circuit 501.

Additionally, the spreader circuit 501 includes an enable signal that ties in with the second and third inputs of each XOR gate. When the enable signal is low, each XOR gate passes its first input, which means the XOR gates pass the outputs of the stump chains 104 in order. When the enable signal is high, the spreader circuit 501 begins spreading the output of the stump chains 104 by allowing the XOR gates to receive the inputs from their second and third inputs. Stated differently, when the enable signal is low, the spreader circuit 501 does not spread the outputs of the stump chains 104. When the enable signal is high, the spreader circuit 501 spreads the outputs of the stump chains 104.

FIG. 7 illustrates an example XOR/rotation circuit 502 in the system 100 of FIG. 5. As seen in FIG. 7, the XOR/rotation circuit 502 includes a series of XOR gates that receive the outputs of the spreader circuit 501 of a test structure 102. Additionally, these XOR gates receive the outputs of a previous test structure 102. The output of the previous test structure 102 may be rotated by 1 bit (e.g., XOR 0 receives the last bit (p31) of the results from the previous test structure 102 and XOR 1 receives the first bit (p0) of the results from the previous test structure 102). The output of the XOR gates is then sent to the next test structure 102. In particular embodiments, by spreading the results from the stump chains 104 using the spreader circuits 501 and then combining with the rotated results from previous test structures 102 using the XOR/rotation circuits 502, the results from an instance are compressed prior to comparison.

Figure 8:
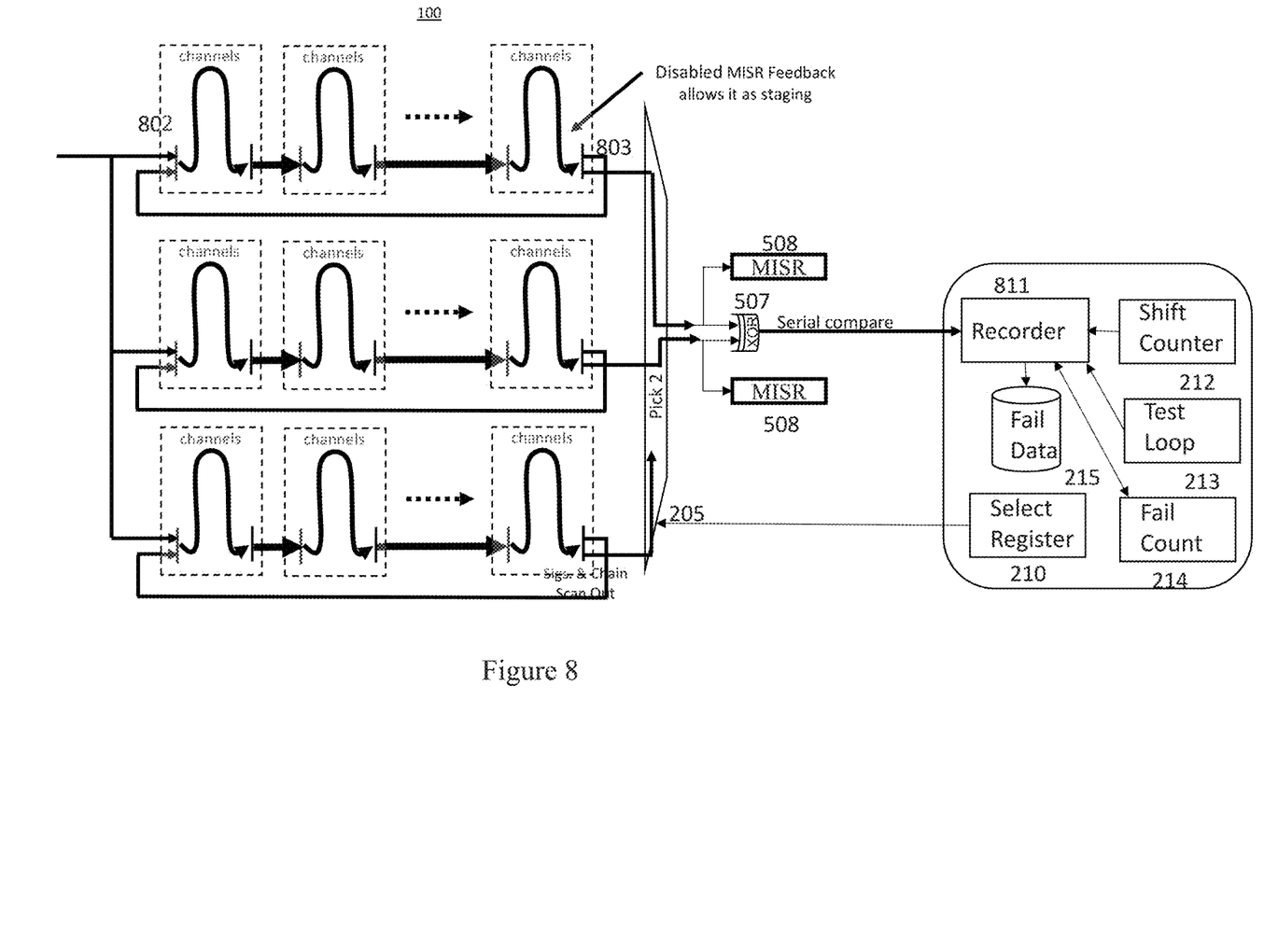
FIG. 8 illustrates an example unload in the system of FIG. 1.

FIG. 8 illustrates an example unload in the system 100 of FIG. 1 such that all the stump chains for each instance can be concatenated into a serial scan chain during the diagnostic unload process. Generally, the test structures 802 shown in FIG. 8 can be used with both BIST structures and deterministic test data. For example, deterministic test data can be loaded serially and concurrently to all the instances channels of the test structures 802. A feedback loop 803 may feed the outputs back through the test structures 802 for compression purposes. The results from the instances may be selected and compared by the comparator 507. The recorder 811 may then log any mismatches in the test results.

Figure 9:
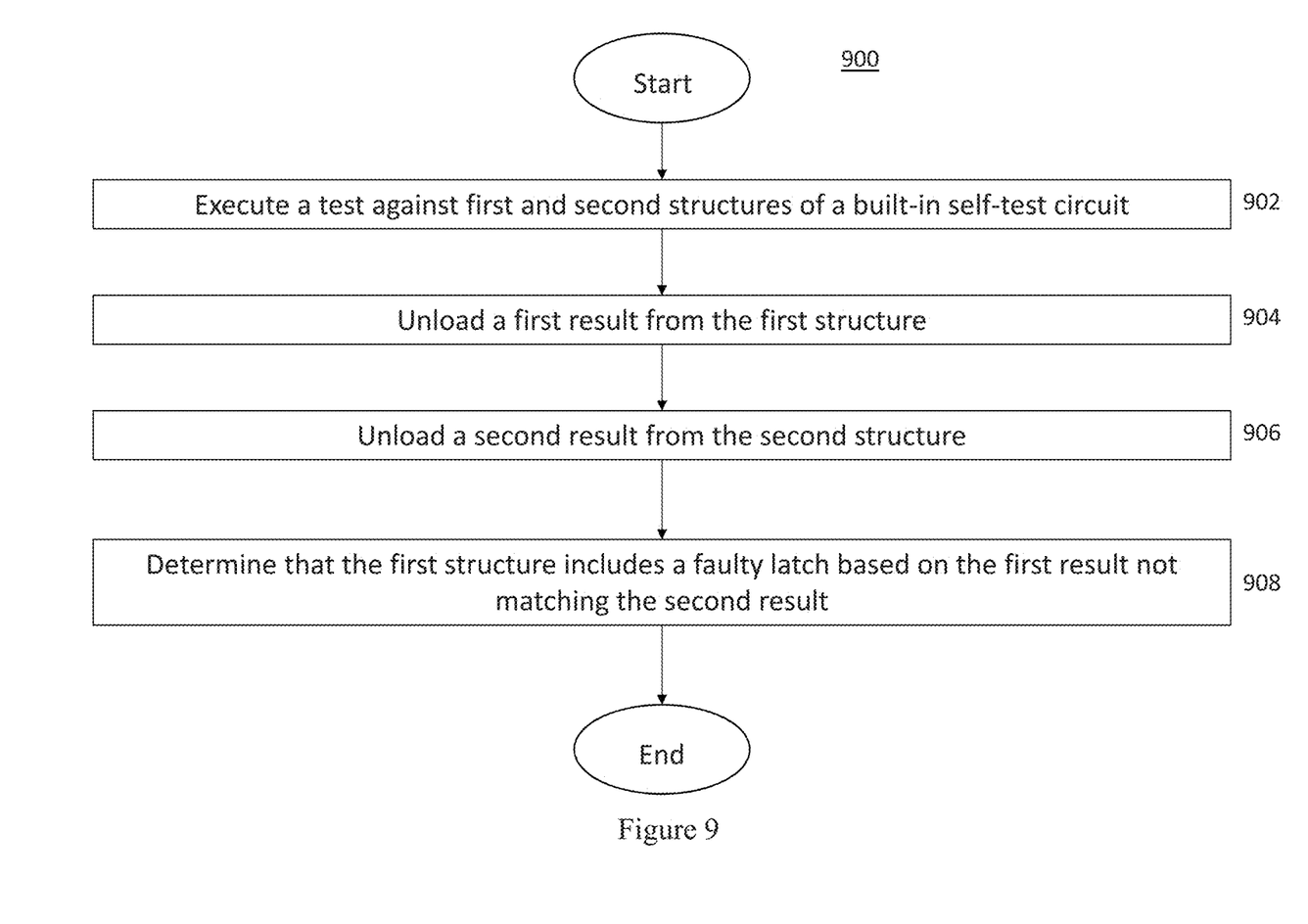
FIG. 9 is a flowchart of an example method in the system of FIG. 1.

FIG. 9 is a flow chart of an example method 900 in the system 100 of FIG. 1. Generally, one or more control circuits 101 may perform the steps of the method 900. In particular embodiments, by performing the method 900, the control circuits 101 unload and analyze test results to determine faulty latches 105 and faulty circuit components. Additionally, the control circuits 101 diagnose the cause of the faulty latch 105 and the faulty circuit element.

In step 902, the control circuit 101 executes a test against first and second test structures 102 of a built-in self-test circuit. Executing the test may involve sending deterministic test data or pseudo-random test data through the test structures 102. The test data may be sent through latches 105 organized as stump chains 104. Circuit elements may be tested using the test data in a latch 105 and the results of that test are then loaded back into the latch 105. The latch 105 propagates the test data to another latch 105 before loading the test results into the latch 105. The test is complete when the test data has propagated through the latches 105 and the latches 105 hold the test results.

In step 904, the control circuit 101 unloads a first result from a first test structure 102. Concurrently, in step 906, the control circuit 101 unloads a second result from a second test structure 102. The control circuit 101 may unload these test results using any suitable process. For example, the control circuit 101 may unload these test results one stump chain 104 at a time according to the process shown in FIG. 2. The control circuit 101 may unload the test results as slices 305 of latches 105 according to the process shown in FIG. 3. The control circuit 101 may also unload the test results serially according to the process shown in FIG. 4. When the test results are unloaded, they are compared to determine mismatches.

In step 908, the control circuit 101 determines that the first structure 102 includes a faulty latch 105 based on the first result not matching the second result. For example, the control circuit 101 may implement a recorder 211 that records mismatches and information pertaining to the mismatches in a shift counter 212 that allows the control circuit 101 to identify the test structure 102, the stump chain 104, and the latch 105 corresponding to the mismatch. After identifying the faulty latch 105, the control circuit 101 may determine the circuit element that was tested using the test data in the faulty latch 105. In this manner, the control circuit 101 may identify the faulty circuit element. Additionally, the recorder 211 may have logged the test loop 213 where the mismatch occurred. The control circuit 101 may use that information to identify the test data that caused the mismatch. The recorder 211 may also log the faulty test results. The control circuit 101 may review the faulty test results to diagnose a cause of the mismatch. In this manner, the control circuit 101 may identify a faulty latch 105 and a faulty circuit element and diagnose a cause for the fault in particular embodiments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method comprising:
   executing a test against a first structure and a second structure of a built-in self-test circuit, each of the first and second structures comprising a plurality of latches arranged as a plurality of stump chains;
   unloading a first result of the test from the plurality of stump chains of the first structure and a second result of the test from the plurality of stump chains of the second structure;
   generating a first signature based on the first result and a second signature based on the second result;
   determining that the first structure failed the test based on the first signature mismatching a reference signature and that the second structure passed the test based on the second signature matching the reference signature;
   comparing the first result to the second result to identify a mismatch between the first result and the second result; and
   determining a faulty latch in the first structure based on the mismatch.

2. The method of claim 1, further comprising toggling multiple input signature registers of the first and second structures to operate as shift registers.

3. The method of claim 1, wherein unloading the first and second results comprises:
   unloading a first stump chain of the first structure and a first stump chain of the second structure; and
   unloading a second stump chain of the first structure and a second stump chain of the second structure after unloading the first stump chain of the first structure and the first stump chain of the second structure.

4. The method of claim 1, wherein unloading the first and second results comprises:
   unloading, from each stump chain of the plurality of stump chains of the first and second structures, a first latch; and
   unloading, from each stump chain of the plurality of stump chains of the first and second structures, a second latch after unloading the first latch from each stump chain of the plurality of stump chains of the first and second structures.

5. The method of claim 1, wherein unloading the first and second results comprises:
   serially unloading each stump chain of the plurality of stump chains of the first structure; and
   serially unloading each stump chain of the plurality of stump chains of the second structure.

6. The method of claim 1, wherein unloading the first result comprises unloading each latch of a first stump chain of the plurality of stump chains of the first stump such that an output of each latch is input into an XOR gate with outputs of at least two other latches of the first stump chain of the plurality of stump chains of the first stump.

7. The method of claim 1, further comprising loading deterministic test data serially and concurrently to the first and second structures.

8. An apparatus comprising:
   a memory; and
   a hardware processor communicatively coupled to the memory, the hardware processor configured to:
   execute a test against a first structure and a second structure of a built-in self-test circuit, each of the first and second structures comprising a plurality of latches arranged as a plurality of stump chains;
   unload a first result of the test from the plurality of stump chains of the first structure and a second result of the test from the plurality of stump chains of the second structure;
   generate a first signature based on the first result and a second signature based on the second result;
   determine that the first structure failed the test based on the first signature mismatching a reference signature and that the second structure passed the test based on the second signature matching the reference signature;
   compare the first result to the second result to identify a mismatch between the first result and the second result; and
   determine a faulty latch in the first structure based on the mismatch.

9. The apparatus of claim 8, the hardware processor further configured to toggle multiple input signature registers of the first and second structures to operate as shift registers.

10. The apparatus of claim 8, wherein unloading the first and second results comprises:
    unloading a first stump chain of the first structure and a first stump chain of the second structure; and
    unloading a second stump chain of the first structure and a second stump chain of the second structure after unloading the first stump chain of the first structure and the first stump chain of the second structure.

11. The apparatus of claim 8, wherein unloading the first and second results comprises:
    unloading, from each stump chain of the plurality of stump chains of the first and second structures, a first latch; and
    unloading, from each stump chain of the plurality of stump chains of the first and second structures, a second latch after unloading the first latch from each stump chain of the plurality of stump chains of the first and second structures.

12. The apparatus of claim 8, wherein unloading the first and second results comprises:
    serially unloading each stump chain of the plurality of stump chains of the first structure; and
    serially unloading each stump chain of the plurality of stump chains of the second structure.

13. The apparatus of claim 8, wherein unloading the first result comprises unloading each latch of a first stump chain of the plurality of stump chains of the first stump such that an output of each latch is input into an XOR gate with outputs of at least two other latches of the first stump chain of the plurality of stump chains of the first stump.

14. A system comprising:
a built-in self-test circuit; and
a test engine comprising a hardware processor configured to:
  execute a test against a first structure and a second structure of the built-in self-test circuit, each of the first and second structures comprising a plurality of latches arranged as a plurality of stump chains;
  toggle multiple input signature registers of the first and second structures to operate as shift registers;
  unload a first result of the test from the plurality of stump chains of the first structure and a second result of the test from the plurality of stump chains of the second structure;
  generate a first signature based on the first result and a second signature based on the second result;
  determine that the first structure failed the test based on the first signature mismatching a reference signature and that the second structure passed the test based on the second signature matching the reference signature;
  compare the first result to the second result to identify a mismatch between the first result and the second result; and
  determine a faulty latch in the first structure based on the mismatch.

15. The system of claim 14, wherein unloading the first and second results comprises:
  unloading a first stump chain of the first structure and a first stump chain of the second structure; and
  unloading a second stump chain of the first structure and a second stump chain of the second structure after unloading the first stump chain of the first structure and the first stump chain of the second structure.

16. The system of claim 14, wherein unloading the first and second results comprises:
  unloading, from each stump chain of the plurality of stump chains of the first and second structures, a first latch; and
  unloading, from each stump chain of the plurality of stump chains of the first and second structures, a second latch after unloading the first latch from each stump chain of the plurality of stump chains of the first and second structures.

17. The system of claim 14, wherein unloading the first and second results comprises:
  serially unloading each stump chain of the plurality of stump chains of the first structure; and
  serially unloading each stump chain of the plurality of stump chains of the second structure.

18. The system of claim 14, wherein unloading the first result comprises unloading each latch of a first stump chain of the plurality of stump chains of the first stump such an output of each latch is input into an XOR gate with outputs of at least two other latches of the first stump chain of the plurality of stump chains of the first stump.

* * * * *